United States Patent
Kim et al.

(10) Patent No.: US 9,202,742 B1
(45) Date of Patent: Dec. 1, 2015

(54) INTEGRATED CIRCUIT PACKAGING SYSTEM WITH PATTERN-THROUGH-MOLD AND METHOD OF MANUFACTURE THEREOF

(71) Applicants: Woo Jin Kim, Seoul (KR); Sun Jae Kim, Seoul (KR); Chung Lyul Ahn, Chunng-ju si (KR); Hyeon Yi Kang, Tongyeong-si (KR)

(72) Inventors: Woo Jin Kim, Seoul (KR); Sun Jae Kim, Seoul (KR); Chung Lyul Ahn, Chunng-ju si (KR); Hyeon Yi Kang, Tongyeong-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/156,271

(22) Filed: Jan. 15, 2014

(51) Int. Cl.
*H01L 21/768* (2006.01)
*H01L 23/522* (2006.01)
*H01L 21/56* (2006.01)
*H01L 23/31* (2006.01)
*H01L 21/52* (2006.01)
*H01L 23/12* (2006.01)
*H01L 23/16* (2006.01)

(52) U.S. Cl.
CPC ...... *H01L 21/76804* (2013.01); *H01L 23/5226* (2013.01); *H01L 21/52* (2013.01); *H01L 21/56* (2013.01); *H01L 21/563* (2013.01); *H01L 23/12* (2013.01); *H01L 23/16* (2013.01); *H01L 23/3121* (2013.01); *H01L 23/3128* (2013.01); *H01L 23/3135* (2013.01); *H01L 23/3157* (2013.01); *H01L 2225/06548* (2013.01)

(58) Field of Classification Search
CPC ...... H01L 23/12; H01L 23/16; H01L 23/3121; H01L 23/3128; H01L 23/3135; H01L 23/3157; H01L 21/52; H01L 21/56; H01L 21/563; H01L 2225/06548
USPC ................... 257/686, 774; 438/126
See application file for complete search history.

(56) References Cited

U.S. PATENT DOCUMENTS

| | | | |
|---|---|---|---|
| 5,111,278 A * | 5/1992 | Eichelberger | 257/698 |
| 7,633,765 B1 | 12/2009 | Scanlan et al. | |
| 8,039,303 B2 | 10/2011 | Shim et al. | |
| 8,053,275 B2 | 11/2011 | Hasegawa | |
| 8,283,205 B2 | 10/2012 | Pagaila et al. | |
| 8,456,018 B2 | 6/2013 | Park et al. | |
| 2004/0136123 A1* | 7/2004 | Nakamura et al. | 361/35 |
| 2005/0184377 A1* | 8/2005 | Takeuchi et al. | 257/686 |
| 2011/0068481 A1* | 3/2011 | Park et al. | 257/777 |
| 2013/0273698 A1* | 10/2013 | Shao et al. | 438/127 |
| 2014/0367848 A1* | 12/2014 | Chi et al. | 257/737 |

OTHER PUBLICATIONS

U.S. Appl. No. 13/929,776, filed Jun. 27, 2013, Chi et al.

* cited by examiner

*Primary Examiner* — Peniel M Gumedzoe
(74) *Attorney, Agent, or Firm* — Ishimaru & Associates LLP

(57) ABSTRACT

An integrated circuit packaging system, and a method of manufacture thereof, including: a substrate; a device attached on a top surface of the substrate; a mold encapsulating the device, the mold having a through via and a recessed pattern characterized by being formed in a single process; and a conductive via in the through via and a conductive pattern in the recessed pattern characterized by being formed in another single process.

17 Claims, 5 Drawing Sheets

INTEGRATED CIRCUIT PACKAGING SYSTEM WITH PATTERN-THROUGH-MOLD AND METHOD OF MANUFACTURE THEREOF

TECHNICAL FIELD

The present invention relates generally to an integrated circuit packaging system, and more particularly to a system for applying a pattern-through-mold.

BACKGROUND ART

Semiconductor chips have become progressively more complex and highly integrated driven in large part by the need for increasing processing power in a smaller chip size for compact or portable electronic devices, such as cell phones, smart phones, personal media systems, or ultraportable computers.

Highly integrated circuit requests more components to be integrated into one packaging system. This causes larger package size and longer wiring between the components. However, the high density of wires and pins causes signal interference and impacts circuit performance.

Traditional two dimensional (2D) integrated circuit packaging systems require a substrate interposer to carry interconnections between two or more components. This adds to the cost in packaging system and reduces circuitry performance.

The requirement for higher performance circuitry and reduced size packaging are driving the demanding for three dimensional (3D) integrated circuit (IC) stacking systems. Compared with the traditional 2D integrated circuit packaging systems, where multiple ICs are arranged side by side, 3D IC packaging system arrange ICs vertically, stacking one IC on top of another IC and making vertical connections between the ICs.

However, there still remains a need for a precise and cost-effective way of creating 3D IC packaging systems. In view of the shrinking sizes of electronic components, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a substrate; attaching a device on a top surface of the substrate; encapsulating the device in a mold; forming a through via and a recessed pattern in a top surface of the mold in a single process with the via open to the substrate; and forming a conductive via in the through via and a conductive pattern in the recessed pattern.

The present invention provides an integrated circuit packaging system, including: a substrate; a device attached on a top surface of the substrate; a mold encapsulating the device, the mold having a through via and a recessed pattern characterized by being formed in a single process; and a conductive via in the through via and a conductive pattern in the recessed pattern characterized by being formed in another single process.

Certain embodiments of the invention have other steps or elements in addition to or in place of those mentioned above. The steps or the element will become apparent to those skilled in the art from a reading of the following detailed description when taken with reference to the accompanying drawings.

BEST MODE FOR CARRYING OUT THE INVENTION

Figure 1:
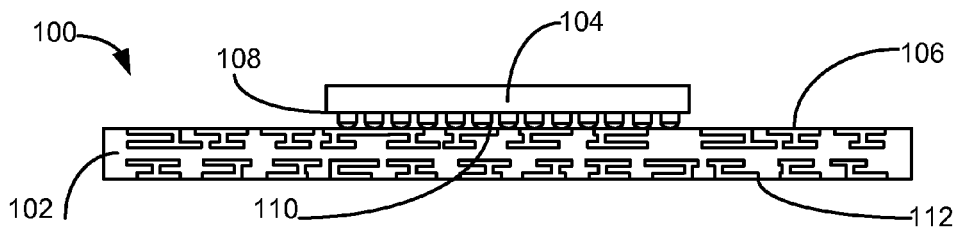
FIG. 1 is a cross-sectional view of a pattern-through-mold integrated circuit packaging system in an early stage of manufacture in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

As demand for small but complex integrated circuits grows, new technologies for highly integrated packaging system have developed. Traditional 2D integrated circuit (IC) packaging system utilizing substrate interposer with long and complicated conductor routing can no longer meet the new demands and in need to be improved.

New 3D integrated circuit packaging system adopting vertical stacking technologies, successfully shrinks IC package size by stacking components vertically one on top of others. The vertical stacking technologies improve circuit performance by eliminating signal interference and reduce power consumption by shortening signal paths. The vertical stacking packaging systems not only use horizontal but also vertical routing paths. Utilizing 3D routing paths improves wire routability for high I/O count and high integrated IC components.

More advanced 3D package-on-package (PoP) systems enable ICs and IC packages to be mounted on base ICs and IC packages. The PoP system is able to integrate more devices efficiently by integrating packages containing multiple active and passive components. The PoP system utilizing existing packages can shorten packaging cycle, improve reliability, and increase the flexibility to integrate different type of components, such as memory chips.

The PoP systems have base packages including a base package substrate, bottom external connectors attached to the external surface of the substrate, a flip chip and top external connectors mounted on the top side of the substrate. The flip chip and the top external connectors are encapsulated.

A laser ablation process creates vias exposing top external connectors from the encapsulation. A substrate interposer is mounted on top of the base package. The external connectors attached to bottom of the substrate interposer fit into the vias of the base package. Circuit connections are established when the top external connectors of the base package and bottom external connectors of the substrate interposer are in contact.

Next, a top package similar to the base package may be mounted on top of the substrate interposer. The top package and bottom package are connected through the substrate interposer.

The substrate interposer in the conventional PoP system introduces additional structure such as the substrate interposer between packages, increases cost of manufacturing, creates prolong signal path, and limits routing flexibility.

Present invention uses direct laser ablation and conductive material filling and plating processes to form conductive contacts, such as conductive vias and thin plates. The conductive contacts connect the base package with various devices electrically. Meanwhile, the laser etching on the mold or the encapsulation top forms signal patterns with conductive contacts in order to connect various devices directly.

Without additional substrate interposer, this PoP system with pattern-through-mold is able to integrate high I/O count devices and reduce package profile comparing to conventional PoP system. This is a cost effective way to stack packages without the substrate interposer.

By eliminating the substrate interposer, the stacking process is simplified. Reduced steps procedure shortens manufactory cycle and increases the productivity. Direct connection between IC devices helps shortening signal path by using mold top conductive contacts, reducing wire delay and wire load, therefore improves the circuitry performance and saves on power consumption. Additionally, package size and profile can be reduced through high integrated circuit.

Referring now to FIG. 1, therein is shown a cross-sectional view of a pattern-through-mold integrated circuit packaging system 100 in an early stage of manufacture in accordance with an embodiment of the present invention. The pattern-through-mold integrated circuit packaging system 100 can include a device carrier, such as a package substrate 102 and a device, such as an integrated circuit including a flip chip 104.

The flip chip 104 is attached on a package substrate top surface 106 upside down, with an active side 108 of the flip chip 104 facing the package substrate top surface 106. A ball grid array 110 provides connections between the flip chip 104 and the package substrate 102.

The package substrate 102 can be a laminate substrate composed of a stack of thin layers or laminates of non-conductive material. Typically, contacts, such as conductive pads and tracks are printed and laminated onto different non-conductive layers. Contacts on different layers are connected with plated through holes or vias. Single layer, double layer or multiple layers are stacked and connected to form a laminate substrate. The circuitry on opposite sides of the substrate can be connected through the built-in contacts of the laminate substrate.

The package substrate 102 serves as a carrier for mounting devices, such as the flip chip 104. It also provides protection for mounted devices as a shield to against physical damage and corrosion. The built-in contacts in the package substrate 102 connect the flip chip 104 to a package substrate external surface 112 at a side opposite the package substrate top surface 106. The flip chip 104 is able to connect to external circuitry, such as a printed circuit board (PCB), through the package substrate 102.

Figure 2:
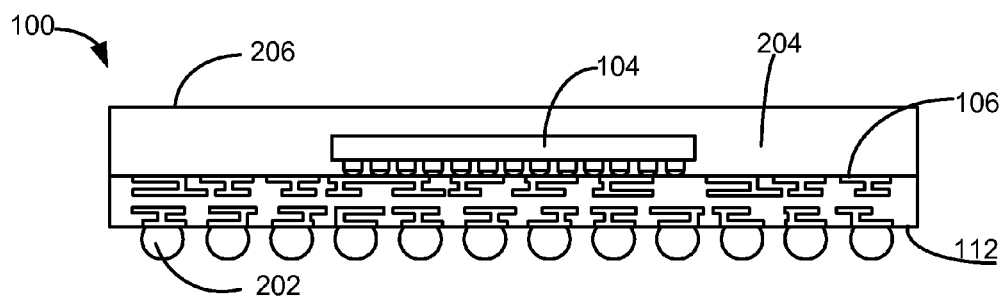
FIG. 2 is FIG. 1 after external connectors are attached.

Referring now to FIG. 2, therein is shown FIG. 1 after external connectors are attached. In this process, external connectors 202, such as solder balls, are attached to the package substrate external surface 112. An encapsulant is molded on is deposited on the package substrate top surface 106 and the flip chip 104, filling the spaces between the flip chip 104 and the package substrate top surface 106 to form a mold 204. The mold 204 is usually made from a resin type material and has a top surface 206.

Figure 3:
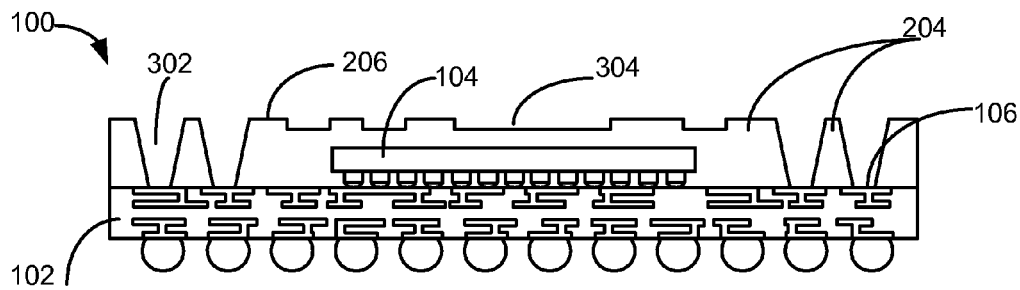
FIG. 3 is FIG. 2 after a single process drilling and patterning process.

Referring now to FIG. 3, therein is shown FIG. 2 after a single process drilling and patterning process. Through vias 302 are laser drilled through the mold 204 to expose the package substrate top surface 106. In the same laser drilling process, the top surface 206 of the mold 204 is patterned to form recessed patterns 304. Characteristics of the same laser drilling process being used for the through vias 302 and the recessed patterns 304 include the same spacing of the laser drilling beam scanning in both as well as the nature of the ablation of material.

Similarly, it has been found that a single process dry film lamination and develop process can be used in place of the single laser drilling process. The through vias 302 and the recessed patterns 304 include characteristics of being formed using laser ablation, drilling, or dry film lamination. The characteristics include physical removal marks, such as laser ablation marks including burned surfaces, drilled marks including uneven surfaces and rough surfaces, and surfaces with residues from lamination materials including dry film.

The recessed patterns 304 are thin and not through the mold 204. The bottoms of the recessed patterns 304 are not exposed to the package substrate 102 or the flip chip 104 to allow the flip chip 104 to be hermetically sealed from the ambient. The recessed patterns 304 may connect one of the through vias 302 to other through vias 302, one of the recessed patterns 304 to other recessed patterns 304, or the through vias 302 to the recessed patterns 304.

The through vias 302 and the recessed patterns 304 are etched by laser ablation, or laser drilling and patterning process. Different laser frequencies and powers are required to etch in different depth. For example, the through vias 302 are deeper than the recessed patterns 304, and the different frequencies and powers are utilized to laser-ablate the through vias 302 and the recessed patterns 304.

Figure 4:
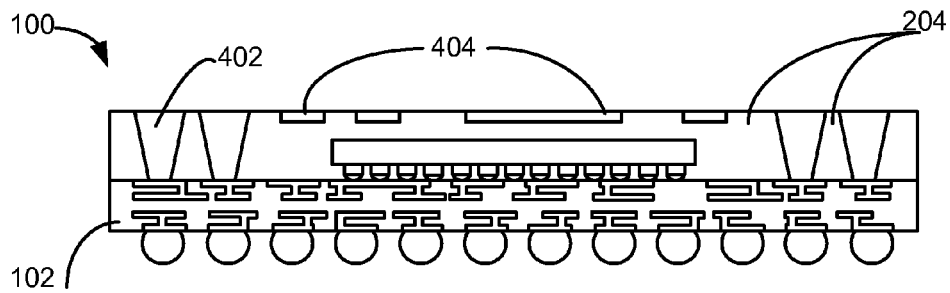
FIG. 4 is FIG. 3 after filling the through vias and the recessed patterns with conductive material.

Referring now to FIG. 4, therein is shown FIG. 3 after filling the through vias 302 of FIG. 3 and the recessed patterns 304 of FIG. 3 with conductive material. The conductive material forms conductive vias 402 and conductive patterns 404. The conductive materials, such as copper (Cu), solder, or other metal alloys, can be used to form the conductive vias 402 and the conductive patterns 404. The through vias 302 and the recessed patterns 304 can be filled by a seed layer deposition and plating process or a screen printing process.

The conductive vias 402 provide connections through the mold 204 to the package substrate 102. The conductive patterns 404 provide connections among the conductive vias 402, or to other conductive patterns 404.

It has been discovered that the single process drilling and patterning process followed by the filing of the through vias 302 and the recessed patterns 304 simultaneously forms structures that are one-piece multi-depth structures in the conductive vias 402 and the conductive patterns 404. These one-piece multi-depth structures have high conductivity and reliability and are characteristic of the use of a single filling process.

In the past, there existed unexpectedly high conductivity and unexplained conduction failures. It was found that forming the through vias and the recessed patterns separately and then filling with the conductive materials to form conductive vias and conductive patterns separately would create metal boundaries that caused resistance and would have poor reliability.

Figure 5:
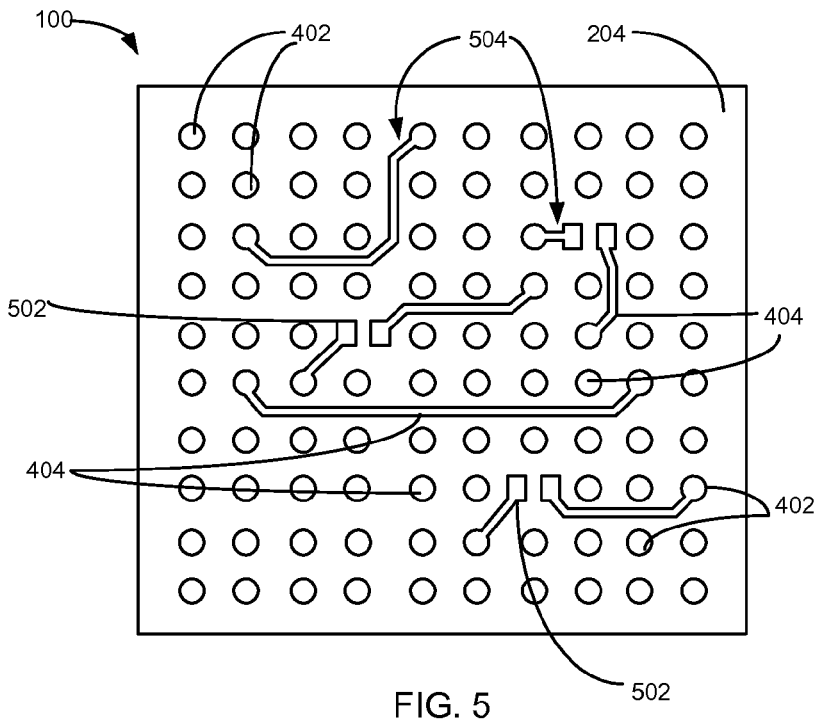
FIG. 5 is the top view of FIG. 4.

Referring now to FIG. 5, therein is shown the top view of FIG. 4. The conductive vias 402 are formed around the flip chip 104 of FIG. 1 through the mold 204. The conductive patterns 404 are formed in top of the mold 204 above the flip chip 104.

The conductive patterns 404 can include component pads 502 for passive components, such as capacitors or resistors. The component pads 502 are rectangular conductive pads that can be connected to I/O pads of top mounting or surface mounted devices. One-piece multi-depth structures 504 have no internal metal boundaries between the conductive patterns 404 and the conductive vias 402, or among the conductive patterns 404. These one-piece multi-depth structures 504 have high conductivity and reliability due to no internal metal boundaries, and are characteristic of the use of a single filling process.

Figure 6:
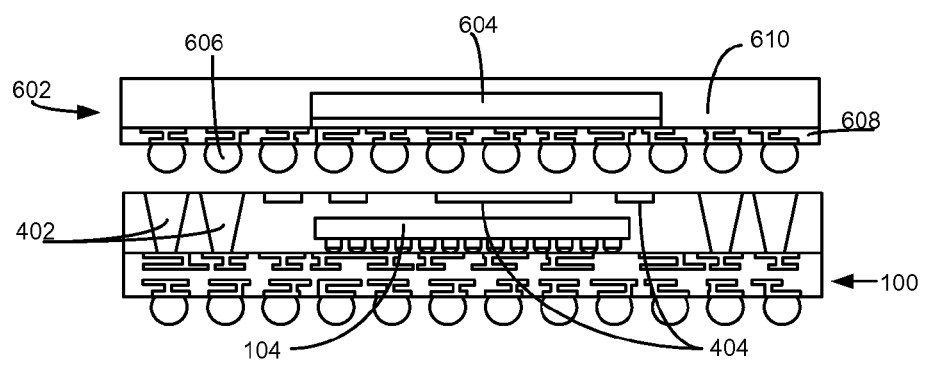
FIG. 6 is FIG. 4 with a top package being mounted on the pattern-through-mold integrated circuit packaging system.

Referring now to FIG. 6, therein is shown FIG. 4 with a top package being mounted on the pattern-through-mold integrated circuit packaging system 100. A top package 602 could contain an additional device 604, such as a semiconductor device including a flip chip or an integrated circuit die, in an encapsulant 610.

External connectors 606, such as solder balls, are attached to a bottom surface of a top package substrate 608. The external connectors 606 are soldered onto the conductive vias 402 and the conductive patterns 404 of the pattern-through-mold integrated circuit packaging system 100.

The additional device 604 in the top package 602 is stacked and can be electrically connected to the flip chip 104 in the pattern-through-mold integrated circuit packaging system 100 through the top package substrate 608, the external connectors 606, the conductive vias 402 and the conductive patterns 404.

Figure 7:
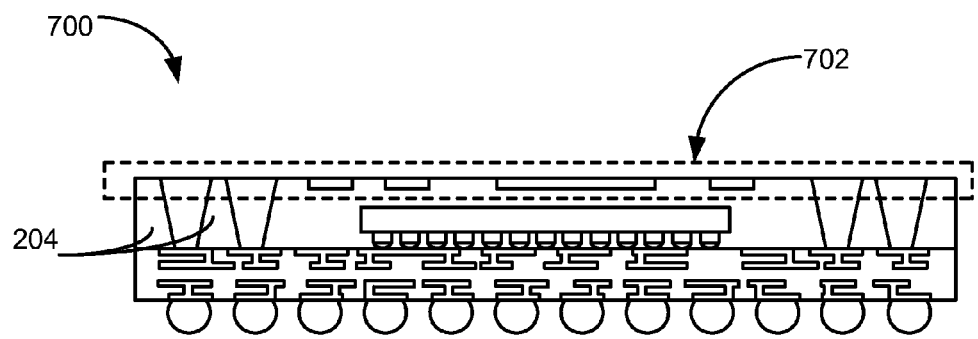
FIG. 7 is a structure similar to FIG. 4.

Referring now to FIG. 7, therein is shown a structure similar to FIG. 4. A pattern-through-mold integrated circuit packaging system 700 has a top surface of the mold 204 encircled by a dotted line 702 to indicate an alternate embodiment from FIG. 4.

Figure 8:
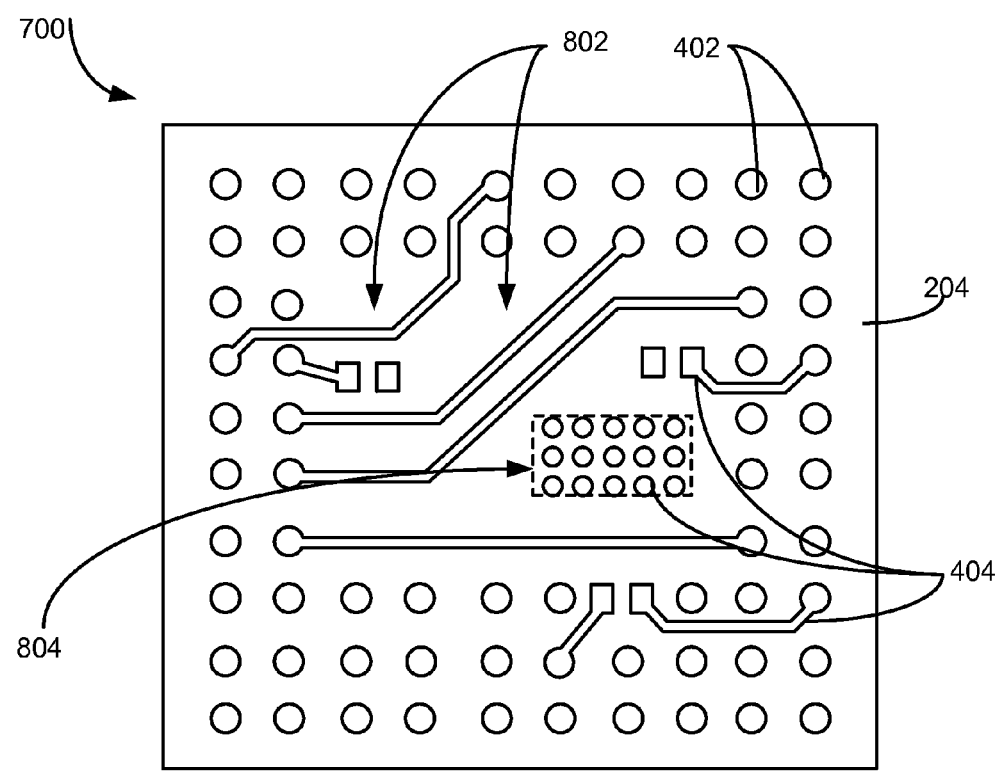
FIG. 8 is a top view of FIG. 7.

Referring now to FIG. 8, therein is shown a top view of FIG. 7. The pattern-through-mold integrated circuit packaging system 700 has the conductive vias 402 and the conductive patterns 404 are pattern to where the connections are needed.

In addition, there are open areas 802 where no conductive connectors are needed for connections. Further, there is a small matrix array area 804 where a small active device may be mounted.

Since only the conductive vias 402 and the conductive patterns 404 that are needed are formed and patterned, there are more of the open areas 802 for routing. The small matrix array area 804 increases routing flexibility for high density devices and complex routing paths. The conductive patterns 404 can be shortened by straight line connections crossing the open areas 802, rather than zigzagged paths. This provides a better routability per each layer of the top or bottom package due to sufficient routing spaces. In the meanwhile, it may lead to good power and signal integrity.

Higher density conductive patterns or conductive vias are patterned to match high I/O count devices. The small matrix array area 804 can be patterned to match the pins of the active devices, which can be mounted directly on top of the mold 204, without an additional routing structure or a substrate interposer. Each pin of the active devices is connected to one of the conductive patterns 404 in the small matrix array area 804 or other conductive area, for electrical connection and device function to eliminate routing. The small matrix array area 804 makes mounting more flexible for different size and pin out devices, improves circuit performance by eliminating unnecessary signal pads and paths, reduces manufacturing cost by simplifying production process, and increases productivity by shortening manufacturing cycles.

The small matrix array area 804 avoids wastage of routing spaces and increases flexibility for mounting high I/O count devices. Direct connections shorten signal paths, improve signal quality and package reliability. Less crowed routing reduces signal interference and improves circuit performance.

Figure 9:
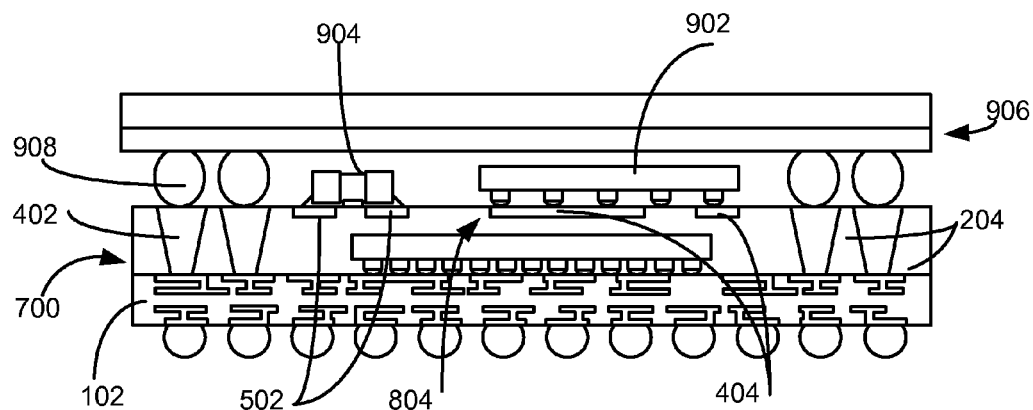
FIG. 9 is FIG. 7 after various devices are mounted.

Referring now to FIG. 9, therein is shown FIG. 7 after various devices are mounted. Active devices 902 can be mounted on top of the mold 204 on the conductive patterns 404 in the small matrix array area 804. Passive devices 904 can be mounted on top of the mold 204 on the conductive patterns 404 on the component pads 502.

A shield 906 for EMI can be mounted above the mold 204 on the conductive vias 402. The routings between multiple devices are implemented through the conductive patterns 404. The active devices 902 and the passive devices 904 may or may not be encapsulated.

The package profile can be reduced by eliminating the encapsulation around the active devices 902 and the passive devices 904. This helps to increase the number of devices that can be stacked when height in limited in a PoP system.

The shield 906 mounted above a base package or the pattern-through-mold integrated circuit packaging system 700, has a circuit return with the package substrate 102 through the conductive vias 402 and external connectors 908 attached to the bottom side of the shield 906. This circuit return can help static charge release through the package substrate 102. The shield 906 can provide protection as a shield for the pattern-through-mold integrated circuit packaging system 700, the mounted active devices 902, and the mounted passive devices 904.

There may be variety types and numbers of devices mounted on top of the mold 204, besides the active devices 902 or the passive devices 904. The mold patterns can be adjusted to suit the I/O pins of the devices and the numbers of the devices. However, the mold patterns are formed by a single plating step regardless of how many and what types of devices are mounted.

Figure 10:
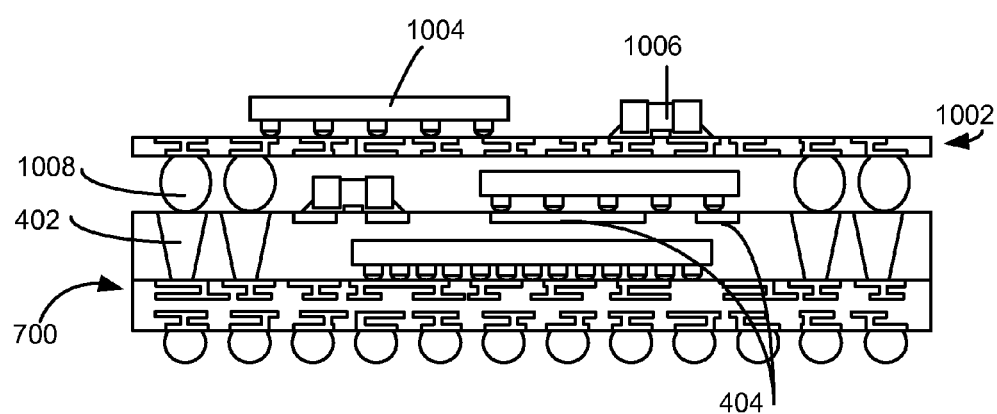
FIG. 10 is FIG. 7 after a top substrate with various devices is mounted.

Referring now to FIG. 10, therein is shown FIG. 7 after a top substrate with various devices is mounted. In this alternate embodiment, an interposer substrate 1002 having a top active device 1004 and a top passive device 1006 is mounted above the pattern-through-mold integrated circuit packaging system 700.

The interposer substrate 1002 has bottom external connectors 1008 or other types of conductive contacts attached to the bottom surface of the interposer substrate 1002. When the interposer substrate 1002 is mounted above the pattern-through-mold integrated circuit packaging system 700, the bottom external connectors 1008 are connected with the conductive vias 402. The connections between the top active device 1004 and the top passive device 1006 with the pattern-through-mold integrated circuit packaging system 700 are established through the interposer substrate 1002, and the bottom external connectors 1008.

Figure 11:
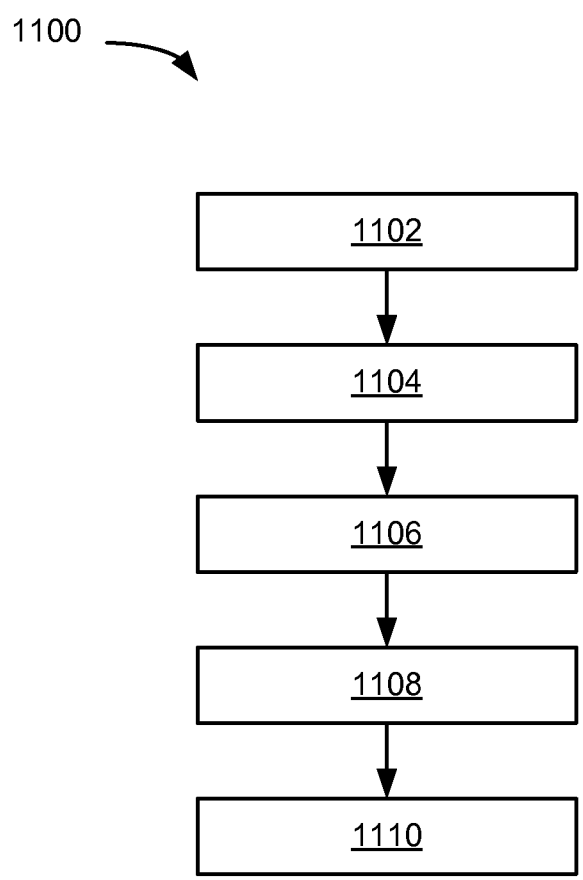
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: providing a substrate in a block 1102; attaching a device on a top surface of the substrate in a block 1104; encapsulating the device in a mold in a block 1106; forming a through via and a recessed pattern in a top surface of the mold in a single process with the via open to the substrate in a block 1108; and forming a conductive via in the through via and a conductive pattern in the recessed pattern in a block 1110.

To improve bonding and performance, multi-layer lamination may be applied on top of the conductive vias 402 and the conductive patterns 404. The additional multi-layer lamination can include, but not limited to copper, gold, nickel, other conductive metals, metal alloys, or mixture of different metals. Different structure and technology can be adapted in multi-layer lamination.

High accuracy laser printing is available on the market for etching the conductive vias and conductive patterns. Pattern lithography using dry film lamination and etching can be applied for etching the conductive vias and conductive patterns.

Copper plating and filling in low depth conductive vias and conductive patterns, can be general method for PCB suppliers using electro or electroless plating with dry film. It has been found that forming conductive vias and conductive patterns in a single plating process is more cost effective than using a substrate interposer.

As alternatives to copper plated and filled vias, the conductive patterns and conductive vias can be filled with solder alloys and other conductive materials, such as silver (Ag), solder-Ag, or Ag—Cu.

In this method, a top package is stacked on top of a base package, without using a substrate interposer. The conductive patterns and conductive vias are created by a single laser ablation process. The conductive material fills the conductive vias and pattern recesses to form through vias and pattern plates in a single step to create unified conductive piece.

It has been discovered that, by using direct laser ablation, embodiments of the present invention are able to form signal patterns with copper plating, or other type of similar plating technique, in order to make a direct connection to various devices though molds in a single step. Without additional substrate interposer, this structure allows high I/O count device with lower package profiles. This is a cost effective way to have packages stacked on top of other packages without substrate interposer, and to utilize ready-to-use packages containing multiple devices rather than mounting each individual device to simplify the manufacturing procedure.

Thus, it has been discovered that the integrated circuit packaging system and device of the present invention furnish important and heretofore unknown and unavailable solutions, capabilities, and functional aspects for pattern-through-mold package in PoP system.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   attaching a device on a top surface of the substrate;
   encapsulating the device in a mold;
   forming through vias and recessed patterns in a top surface of the mold in a single process with the through vias open to the substrate; and forming a one-piece multi-depth structure having conductive vias in the through vias and conductive patterns in the recessed patterns in a single filling process, the conductive patterns having a variety of shapes, depths, and sizes, the conductive patterns being for connections among the conductive vias, the one-piece multi-depth structure has no internal metal boundaries characteristic of the single filling process.

2. The method as claimed in claim 1 wherein forming the through vias and the recessed patterns includes using laser ablation.

3. The method as claimed in claim 1 wherein:
 forming the through vias and the recessed patterns includes drilling the through vias and drilling the recessed patterns at the top surface of the mold; and
 forming the conductive vias and the conductive patterns includes patterning the conductive vias and the conductive patterns such that the conductive patterns are for connections among the conductive vias.

4. The method as claimed in claim 1 further comprising mounting a top package over the conductive vias.

5. A method of manufacture of an integrated circuit packaging system comprising:
 providing a substrate;
 attaching a device on a top surface of the substrate;
 encapsulating the device in a mold;
 forming an external connector at an external surface of the substrate;
 forming through vias and recessed patterns in a top surface of the mold in a single process with the through vias open to the substrate; and
 forming a one-piece multi-depth structure having conductive vias in the through vias and conductive patterns in the recessed patterns in a single filling process, the conductive vias and the conductive patterns have a variety of shapes, depths, and sizes, and the conductive patterns are for connections among the conductive vias, the one-piece multi-depth structure has no internal metal boundaries characteristic of the single filling process.

6. The method as claimed in claim 5 wherein forming the through vias and the recessed patterns includes using laser ablation or dry film lamination.

7. The method as claimed in claim 5 wherein:
 forming the through vias and the recessed patterns includes drilling the through vias with expositions of the top surface, and drilling the recessed patterns at the top surface of the mold before reaching the top surface of the substrate or the device; and
 forming the conductive vias and the conductive patterns includes patterning the conductive vias and the conductive patterns such that the conductive patterns are for connections among the conductive vias.

8. The method as claimed in claim 5 further comprising mounting a top package having an additional device over the conductive vias.

9. An integrated circuit packaging system comprising:
 a substrate;
 a device attached on a top surface of the substrate;
 a mold encapsulating the device, the mold having through vias and recessed patterns characterized by being formed in a single process; and
 a one-piece multi-depth structure having conductive vias in the through vias and conductive patterns in the recessed patterns, the one-piece multi-depth structure has no internal metal boundaries characterized by being formed in a single filling process, the conductive vias and the conductive patterns have a variety of shapes, depths and sizes, and the conductive patterns are for connections among the conductive vias.

10. The system as claimed in claim 9 wherein the through vias and the recessed patterns include physical marks characteristic of being formed using laser ablation.

11. The system as claimed in claim 9 wherein:
 the through vias and the recessed patterns include the through vias and the recessed patterns having drilled marks at a top surface of the mold; and
 the conductive vias and the conductive patterns include the conductive vias and the conductive patterns for connections among the conductive vias and the conductive patterns.

12. The system as claimed in claim 9 further comprising a top package over the conductive vias.

13. The system as claimed in claim 9 further comprising an external connector at an external surface of the substrate.

14. The system as claimed in claim 13 wherein the through vias and the recessed patterns include physical marks characteristic of being formed using laser ablation or dry film lamination.

15. The system as claimed in claim 13 wherein:
 the through vias and the recessed patterns include the through vias with expositions of the top surface, the through vias and the recessed patterns having drilled marks at a top surface of the mold; and the conductive patterns are for connections among the conductive vias.

16. The system as claimed in claim 13 wherein the conductive vias and the conductive patterns include a variety of shapes, depths, and sizes of conductive vias.

17. The system as claimed in claim 13 further comprising a top package having an additional device over the conductive vias.

* * * * *